United States Patent
DeCosta

(10) Patent No.: US 9,705,232 B2
(45) Date of Patent: Jul. 11, 2017

(54) ENCASED POWER RECEPTACLE

(71) Applicant: Thomas DeCosta, Westport, MA (US)

(72) Inventor: Thomas DeCosta, Westport, MA (US)

( * ) Notice: Subject to any disclaimer, the term of this patent is extended or adjusted under 35 U.S.C. 154(b) by 3 days.

(21) Appl. No.: 14/757,862

(22) Filed: Dec. 24, 2015

(65) Prior Publication Data
US 2016/0190725 A1    Jun. 30, 2016

Related U.S. Application Data

(63) Continuation of application No. 13/506,136, filed on Mar. 29, 2012, now Pat. No. 9,263,863.

(51) Int. Cl.
| | | |
|---|---|---|
| H02G 5/00 | (2006.01) |
| H01R 13/502 | (2006.01) |
| H02G 1/00 | (2006.01) |
| H01R 13/70 | (2006.01) |
| H01R 24/30 | (2011.01) |
| H01R 27/02 | (2006.01) |
| H02G 3/12 | (2006.01) |
| H05K 5/06 | (2006.01) |
| H02G 3/14 | (2006.01) |
| H01R 107/00 | (2006.01) |

(52) U.S. Cl.
CPC .......... *H01R 13/502* (2013.01); *H01R 13/70* (2013.01); *H01R 24/30* (2013.01); *H01R 27/02* (2013.01); *H02G 1/00* (2013.01); *H02G 3/12* (2013.01); *H02G 3/121* (2013.01); *H02G 3/14* (2013.01); *H05K 5/06* (2013.01); *H01R 2107/00* (2013.01)

(58) Field of Classification Search
CPC ................................... H02G 5/00; H01B 7/30
USPC ........................................................ 307/147
See application file for complete search history.

(56) References Cited

U.S. PATENT DOCUMENTS

| | | | | |
|---|---|---|---|---|
| 4,255,746 A | * | 3/1981 | Johnson | F21V 33/0076 307/115 |
| 5,693,909 A | * | 12/1997 | McEwen | H02G 3/088 174/58 |
| 6,956,169 B1 | * | 10/2005 | Shotey | H02G 3/121 174/50 |
| 6,967,284 B1 | * | 11/2005 | Gretz | H02G 3/125 174/50 |
| 8,168,887 B2 | * | 5/2012 | Phillips | H02G 3/126 174/481 |
| 2011/0021066 A1 | * | 1/2011 | Squires | H01R 24/70 439/502 |

\* cited by examiner

*Primary Examiner* — Rexford Barnie
*Assistant Examiner* — Joseph Inge

(57) ABSTRACT

The present invention relates to encased receptacle embodiments for mounting to recessed electrical boxes.

4 Claims, 16 Drawing Sheets

ENCASED POWER RECEPTACLE

CROSS-REFERENCE TO RELATED APPLICATIONS

This application claims priority to U.S. Provisional Application No. 61/516,768 filed 7 Apr. 2011 and U.S. Provisional Application No. 61/630,677 filed 16 Dec. 2011, and U.S. Utility application Ser. No. 13/506,136 filed 29 Mar. 2012.

FIELD OF THE INVENTION

The present invention relates to encased receptacles and recessed electrical boxes for mounting these receptacles.

BACKGROUND OF THE INVENTION

Providing electrical power behind a wall structure currently requires the use of a standard electrical receptacle and wiring to be mounted internal to an electrically isolated box to prevent access to the internal wiring. Typically, an electrician is required to complete the installation which requires connecting into existing power and locating the new electrical receptacle and box.

The electrical box includes a cover plate flush mounted to the exterior wall leaving an opening for the power receptacle.

More recently, some electrical appliances, particularly flat screen televisions, are mounted directly to the wall, so that externally connected plugs protruding out of the wall plate interfere with mounting the television in flat abutment with the surface of the wall.

There exists a need for electrically isolated receptacles, that are pre-wired, and can be mounted standalone or external to an electrical box, creating space internal to the wall for isolating plugs and connectors.

SUMMARY OF THE INVENTION

The foregoing and other problems are overcome, and other advantages are realized, in accordance with the disclosed, alternative embodiments of these teachings.

The power solution of the present invention comprises pre-wired electrically isolated female and male receptacles that can be combined with an integrated enclosure to be used in applications where power must be supplied to a remote unit, such as a flat panel TV being hung on a wall (behind wall installation), or in a remote location where an integrated enclosure is necessary for installation and electrical isolation (trade show/outdoor exhibit where remote power is utilized on a temporary wall fixture).

For behind wall installations the invention may combine isolated power receptacles in combination with existing "Deep Box" mounting enclosures. The "deep box" enclosures allow for the input and output receptacles of the present invention to be mounted deep inside a wall for visual isolation of receptacle outlets and associated plugs/connectors that may also be present in the enclosure.

In a behind wall installation, the integrated enclosures containing the female and male receptacles are separated behind a wall such that power can be supplied to the female end from an external source (such as an extension cord) which will supply power to a male receptacle mounted interior to the wall. The integrated enclosures for the receptacles are necessary to facilitate mounting in a variety of forms. Both the power input (female end) and power output (male end) integrated enclosures of the present invention may contain a mounting frame for installation directly to a wall surface or onto any type of faceplate or in-wall enclosure, such as the "deep box" mounting enclosures illustrated herein.

The integrated enclosures facilitate mounting of the power output and power input to a variety of electrical boxes including standard electrical boxes, flush mounted wall plates, and "deep boxes" disclosed herein. Since the receptacles are encased and pre-wired, they are not required to be mounted internal to an electrical box for electrical isolation. This allows for the receptacles to be mounted externally to the electrical box enclosure, creating additional space within the box necessary for hiding connectors and the like. The encased receptacles may also be rough mounted to any wall surface.

The power input and power output integrated enclosure of the present invention are formed in a single or two piece joinable encasement. The receptacles are electrically connected within the integrated enclosure at the factory (pre-wired) and the electrical coupling between the enclosures can be ordered in specific lengths to meet the needs of a particular installation.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENTS

While certain embodiments of the present invention have been illustrated and described herein, the present invention should not be limited to such illustrations and descriptions. It should be apparent to those skilled in the art that changes and modifications may be incorporated and embodied as part of the present invention and are within the scope of the claims.

Figure 8:
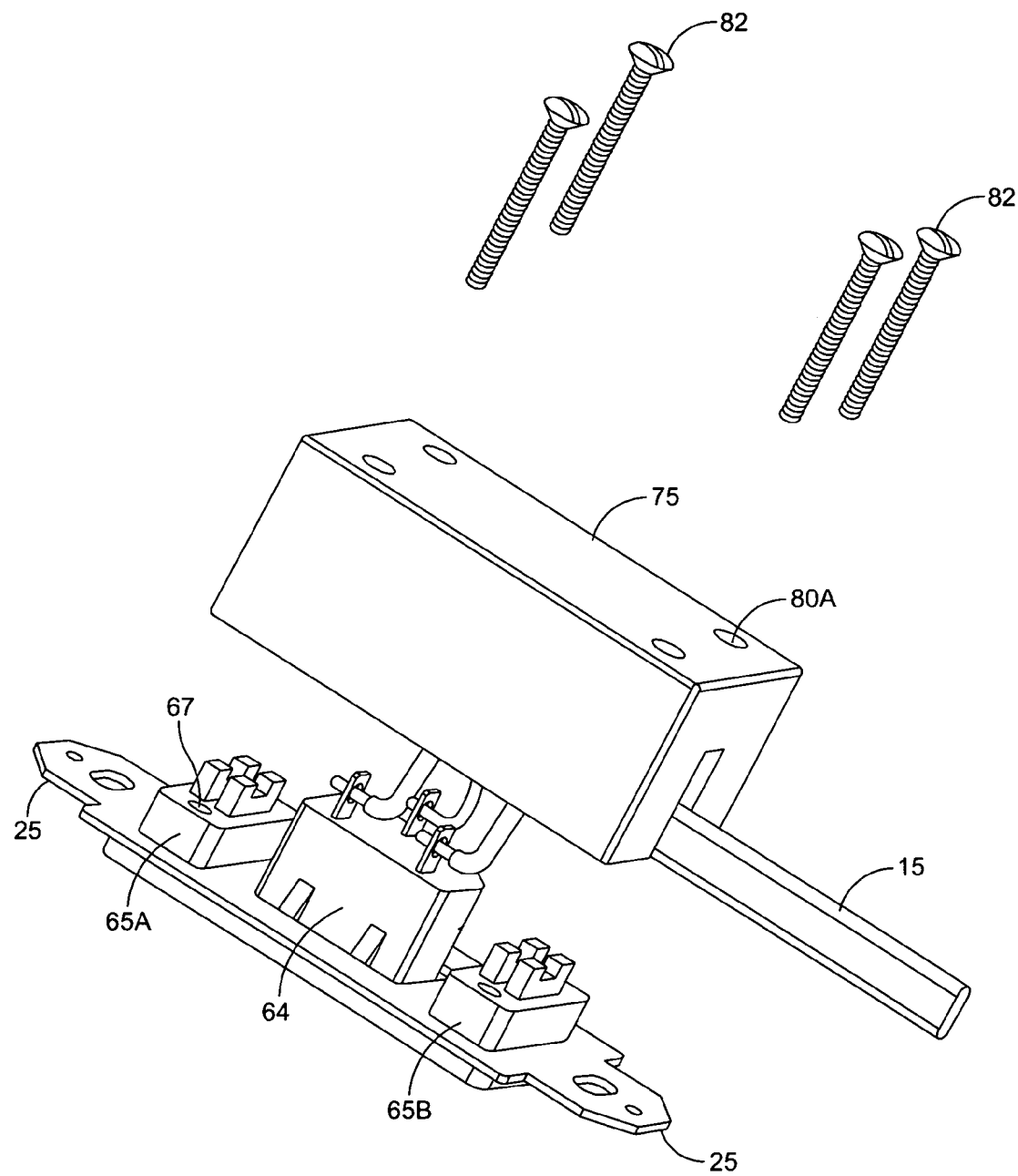
FIG. 8 illustrates the assembled mounting frame and frame support member of FIGS. 2 and 4 prior to final assembly into the housing embodiment of FIG. 7.
Figure 10:
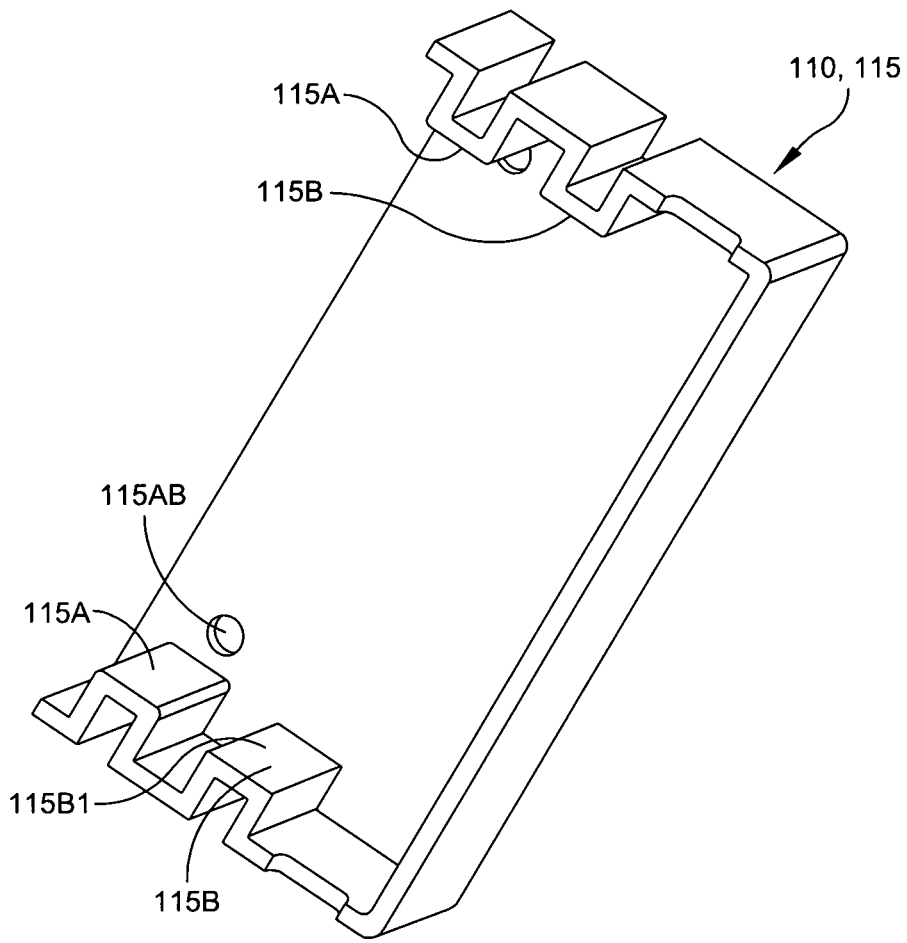
FIGS. 10-13 illustrate an alternative housing embodiment consisting of two joinable sections for encasing an alternative embodiment of the mounting frame and frame support member of FIGS. 2 and 4.

Embodiments of encased receptacles are illustrated in FIGS. 8 and 10. It is understood that all embodiments of encased receptacles described herein are mountable to the recessed electrical boxes described herein.

Figure 11:
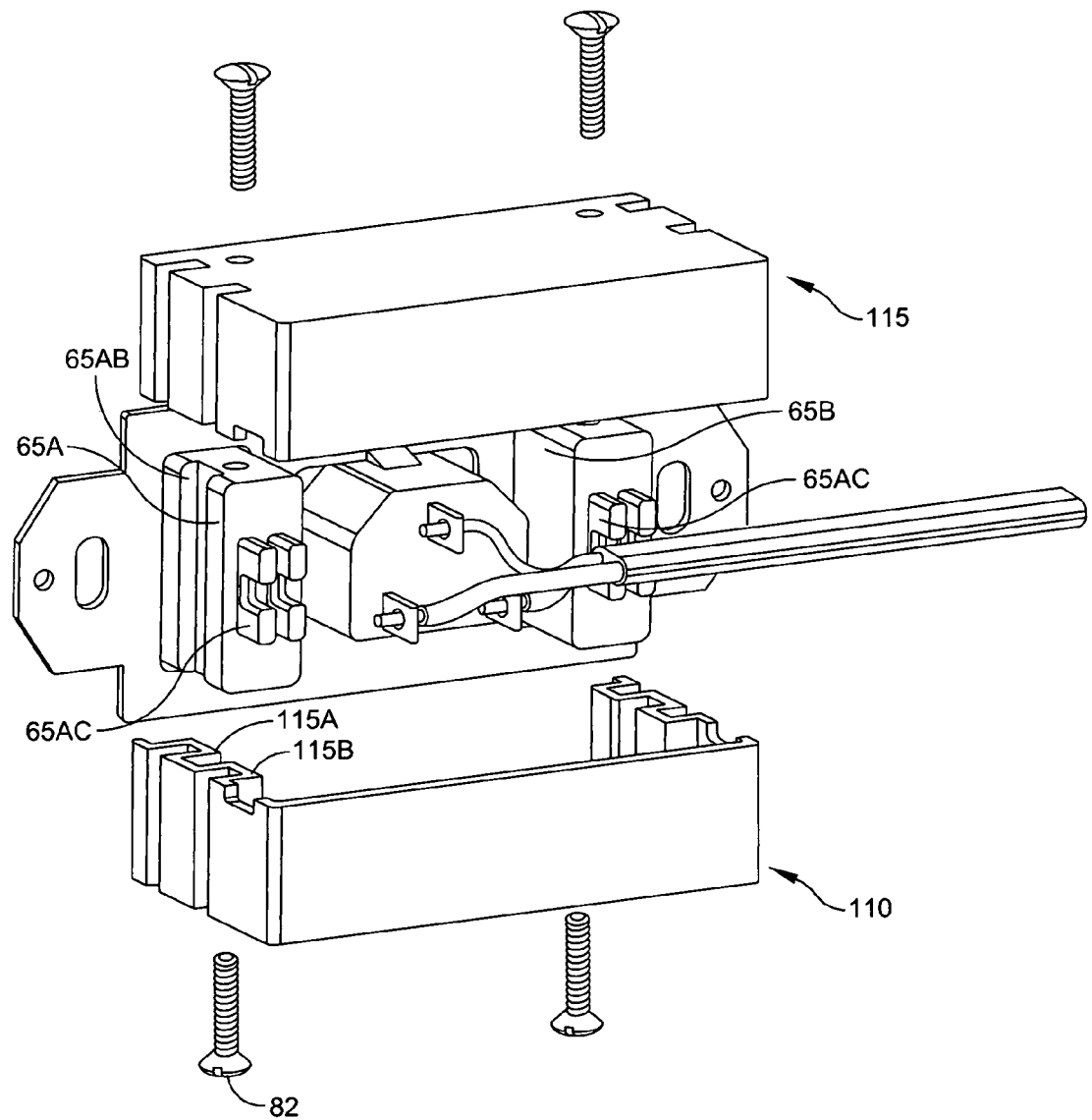
Figure 14:
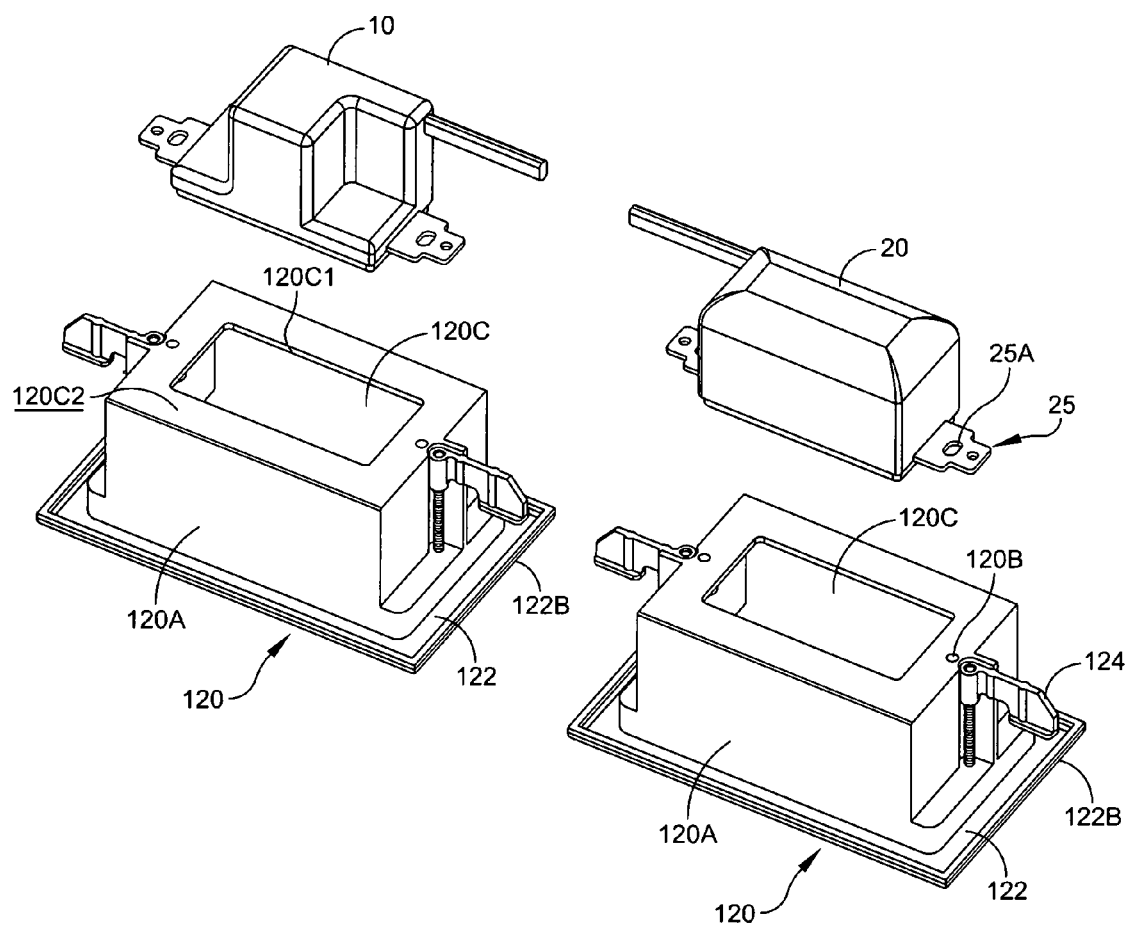
FIGS. 14-16 illustrate the encased receptacles of the present invention in combination with a recessed electrical box.
Figure 15:
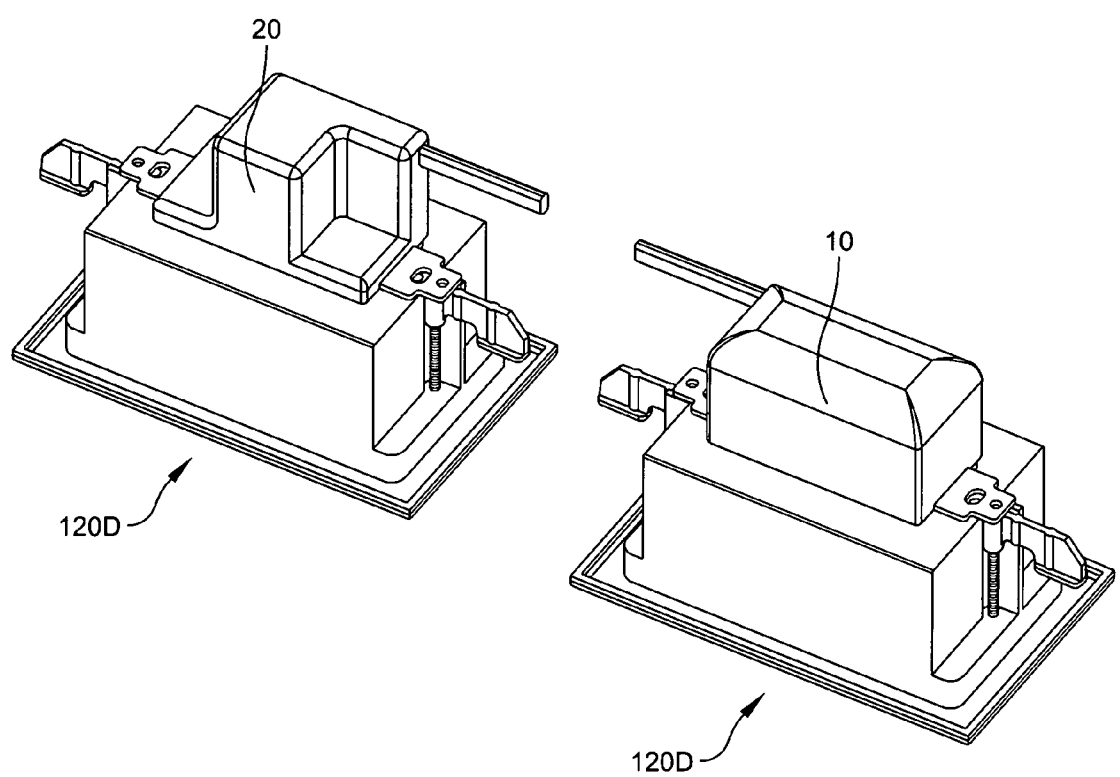
Figure 16:
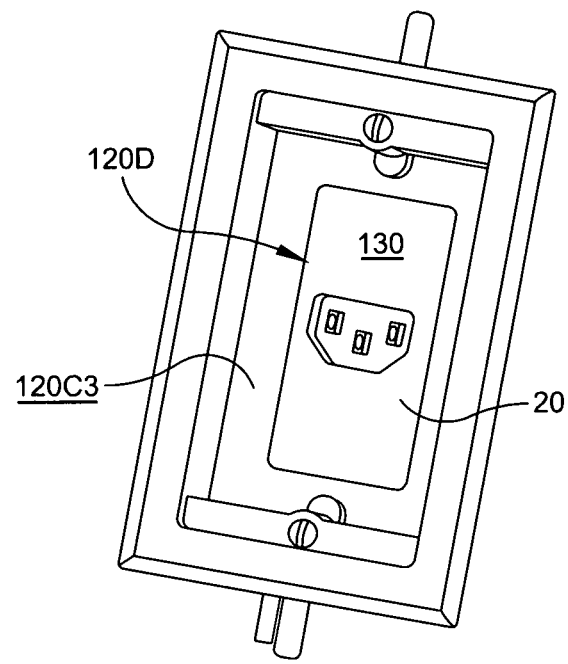
Figure 16:
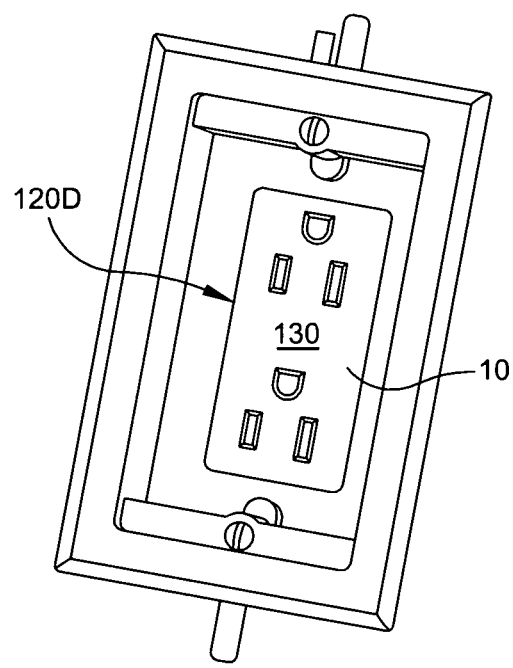

As illustrated in FIGS. 8 and 11, various embodiments of recessed electrical boxes for encased power input 20 and power output 10 are contemplated, provided the encasement ensures electrical isolation and can meet applicable building codes. Embodiments of encased receptacles, as illustrated in FIGS. 8 and 11, may be used as illustrated in FIGS. 14-16.

Figure 1:
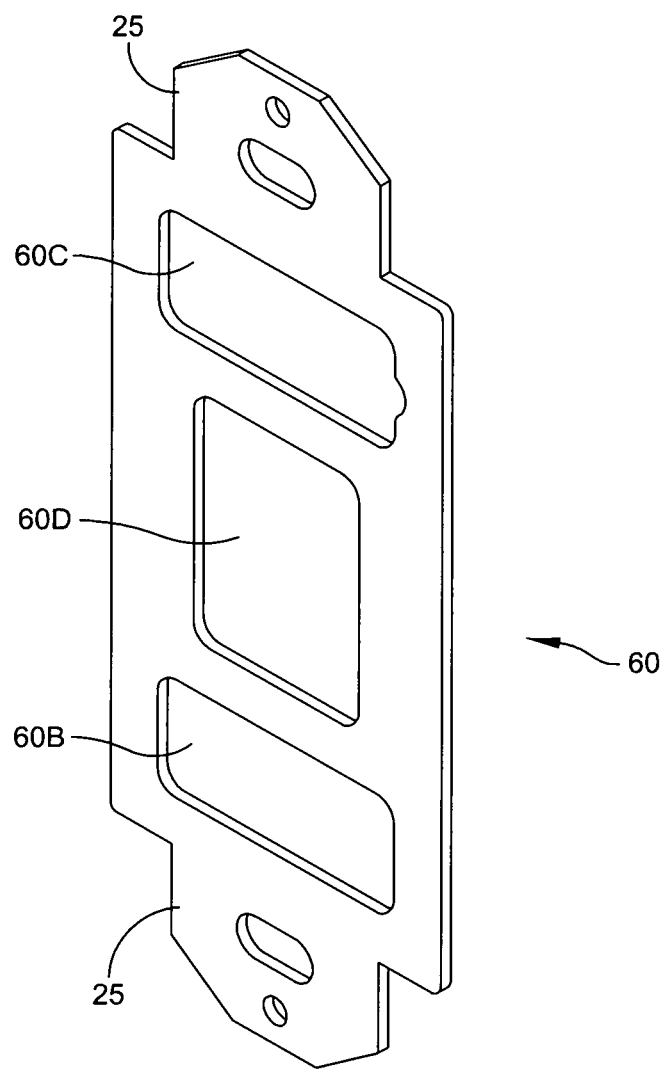
FIG. 1 illustrates a mounting frame utilized in the current invention.
Figure 2:
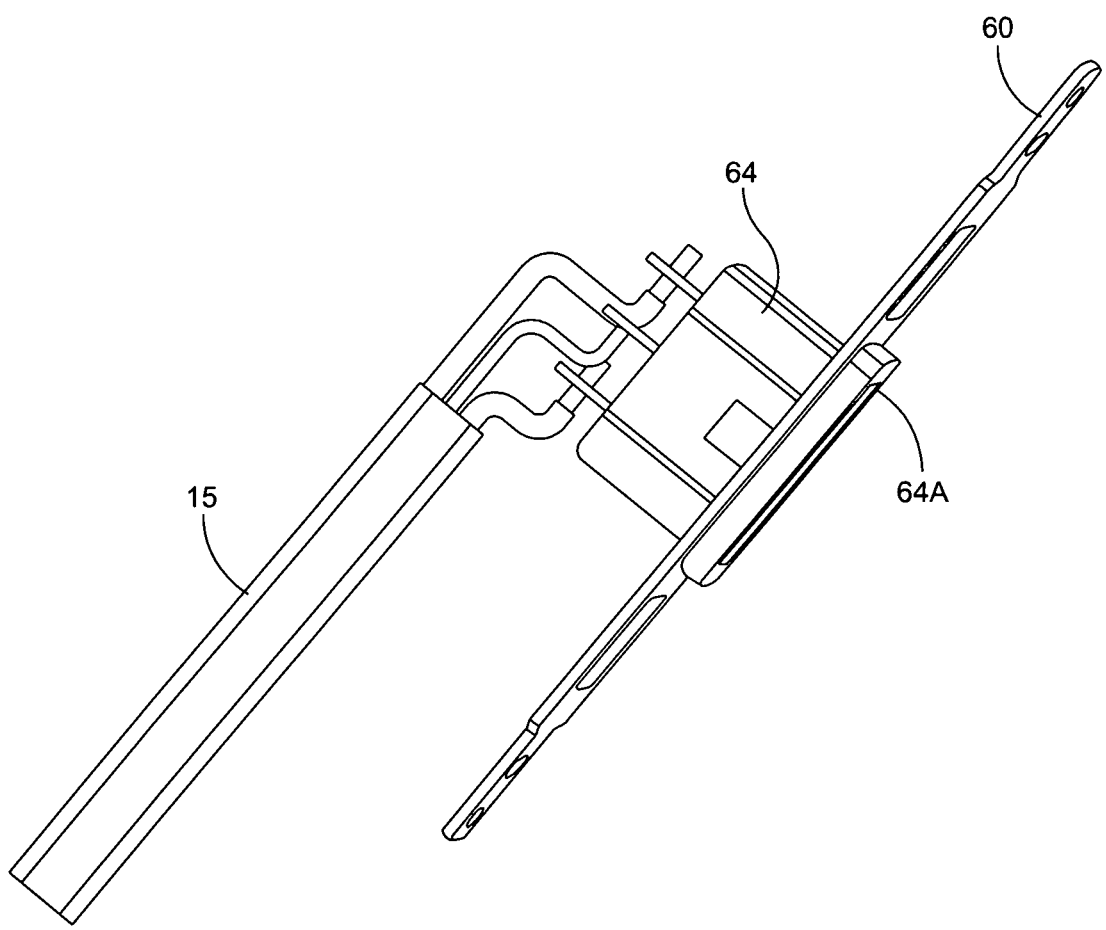
FIGS. 2-3 illustrates an IEC power receptacle integrated into the mounting frame of FIG. 5.
Figure 3:
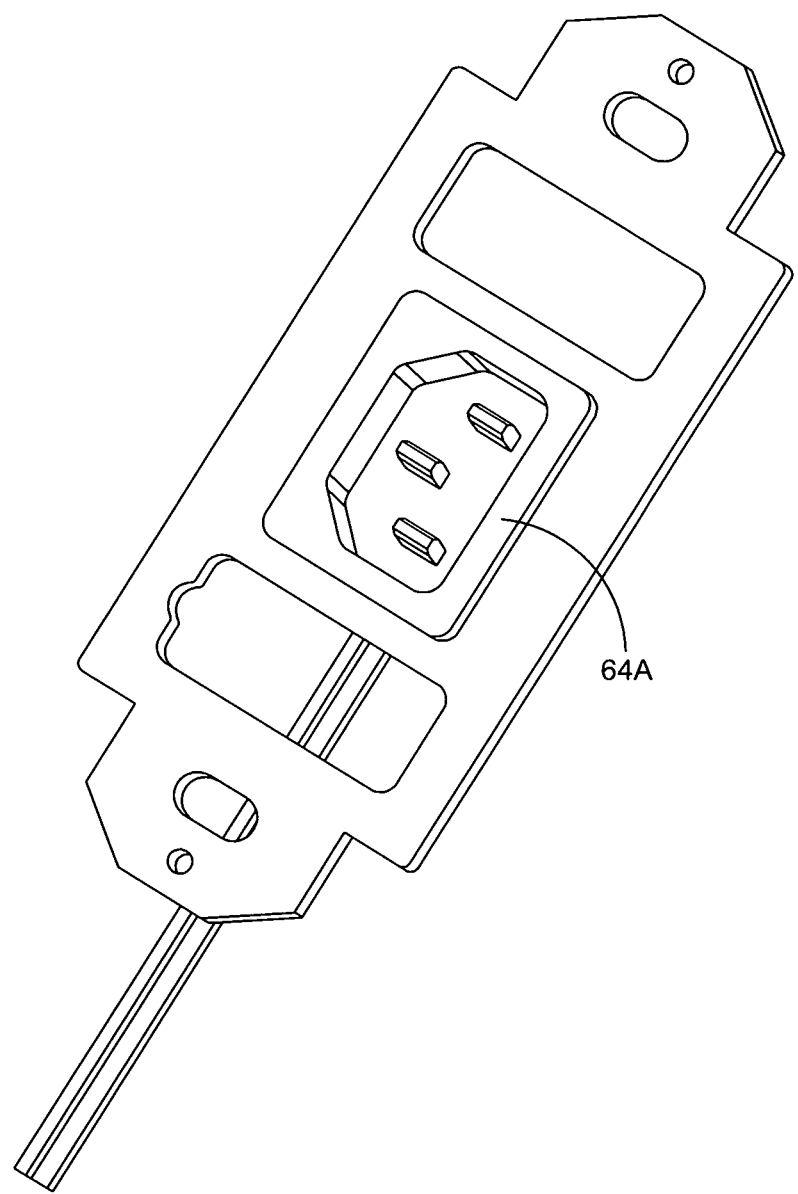
Figure 4:
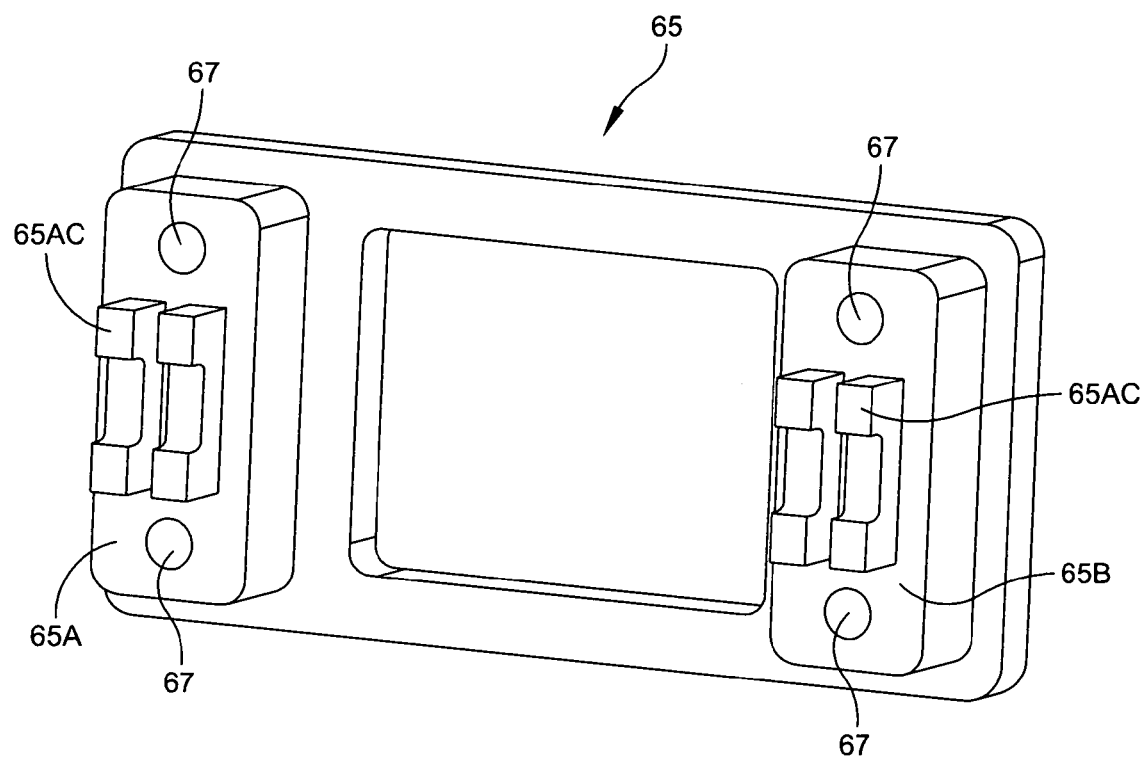
FIG. 4 illustrates one embodiment of a frame support member utilized in the current invention.

As illustrated in FIGS. 2,3, and 8, an encased receptacle is formed around an IEC power input connector 64. It is contemplated by the present invention to include other connector types to be encased including standard NEMA, standard duplex, and non-standard custom connectors. Referring to FIGS. 1 and 4, a mounting frame 60 includes opposed tabs 25, an opening 60D to receive an IEC power receptacle 64 therein, and openings 60B and 60C to receive stanchions 65A and 65B of frame support member 65.

Figure 5:
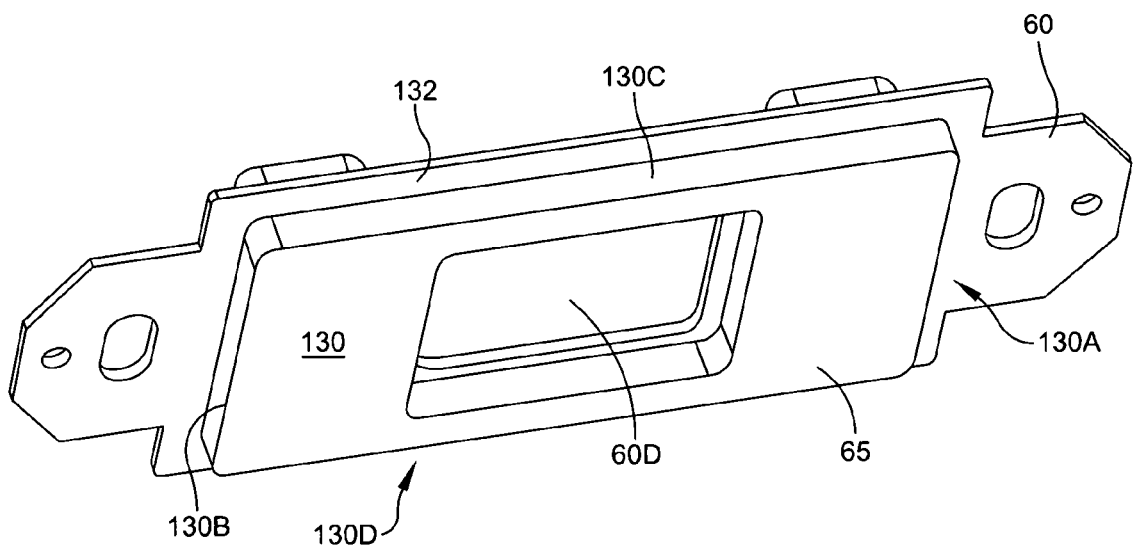
FIGS. 5-6 illustrate the assembled mounting frame of FIG. 1 and frame support member of FIG. 4.
Figure 6:
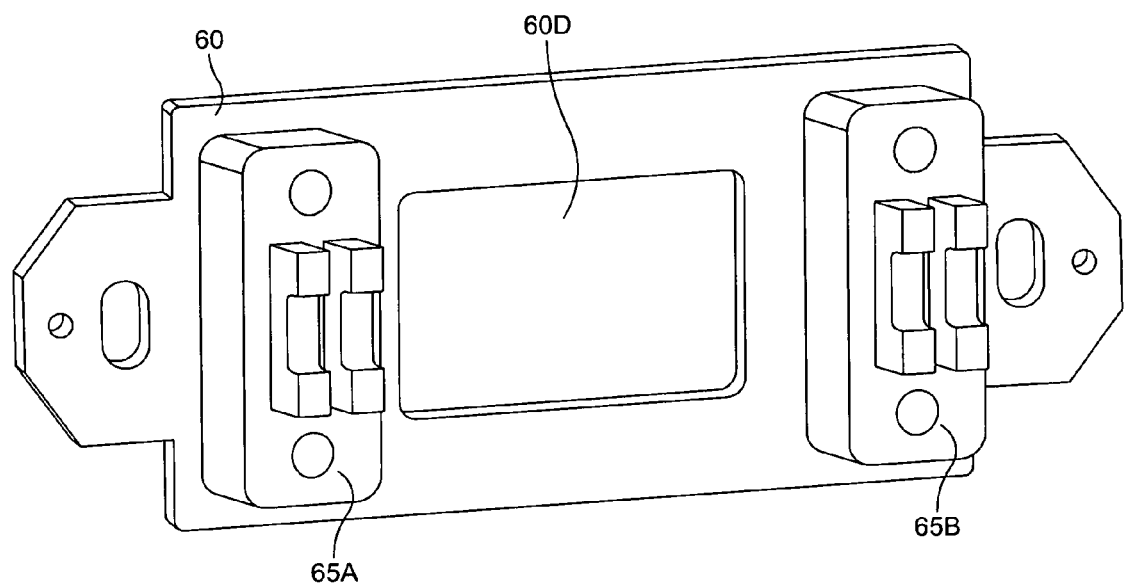
Figure 7:
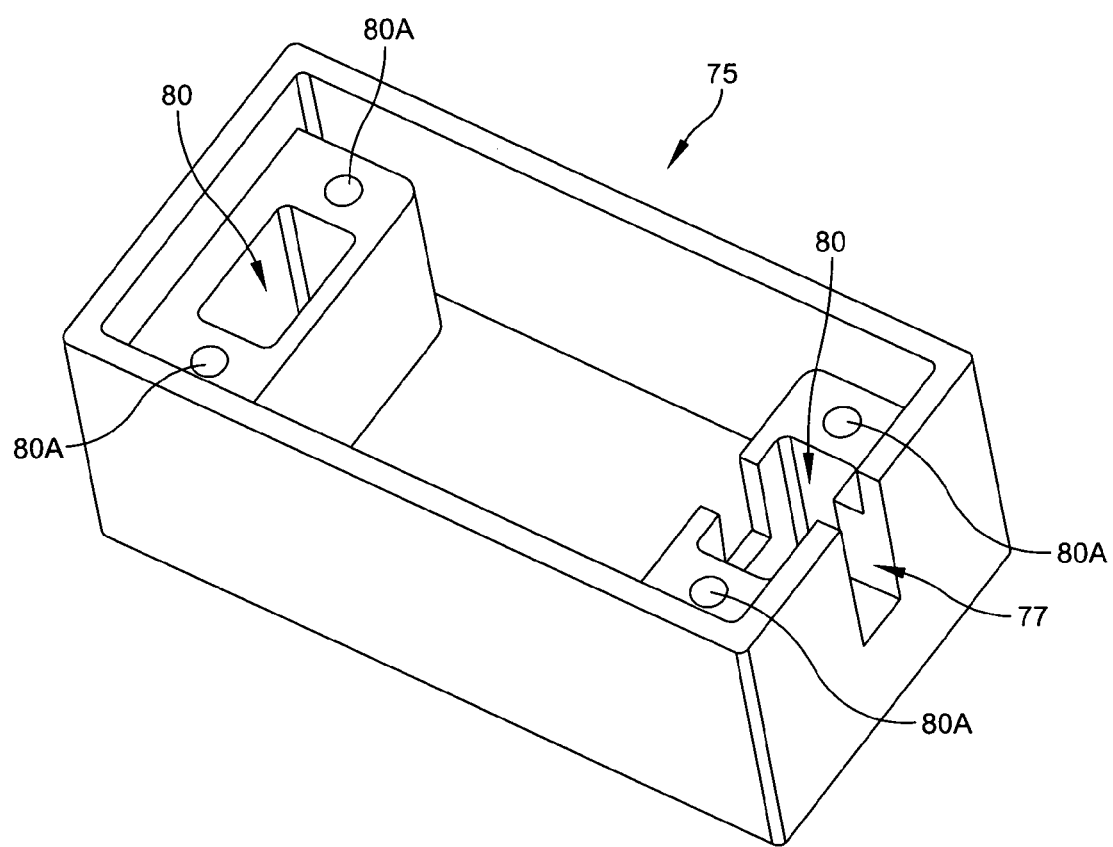
FIG. 7 illustrates a housing embodiment of the encased receptacles of the subject invention.

As illustrated in FIGS. 2 and 3, IEC 64 fits snugly into opening 60D, and includes a surface extension 64A which may be further secured to frame 60 by any means known in the art such as gluing. As illustrated in FIGS. 5 and 6, frame support member 65, including stanchions 65A and 65B, snugly engage through openings 60B and 60C (FIG. 1). Referring to FIGS. 7,8 Stanchions 65A and 65B allow for engagement into housing 75 apertures 80 to secure housing 75 to frame 60. It is understood that opening 60D may be sized accordingly to accommodate various receptacle types.

As illustrated in FIGS. 5,6 stanchions 65A and 65B are snugly fit within frame 60, and frame support member 65 and mounting frame 60 can further be glued to remain securely affixed.

Figure 9:
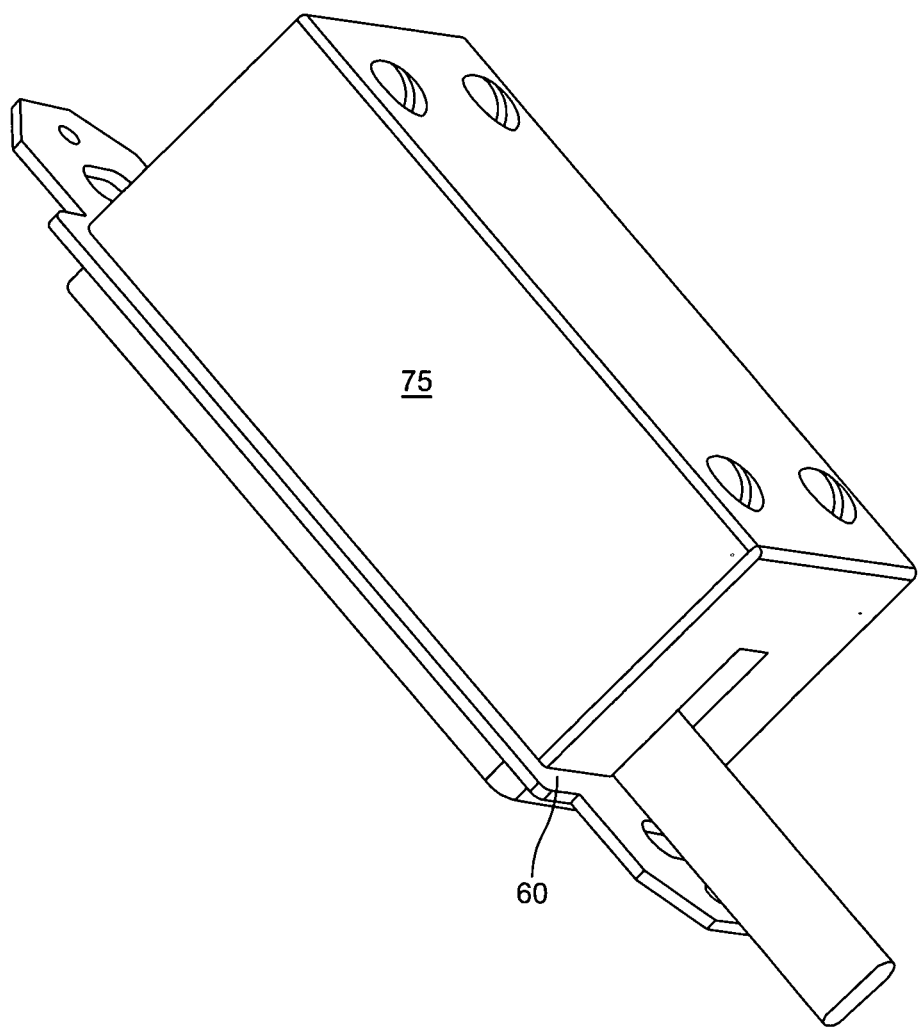
FIG. 9 illustrates the assembled housing embodiment of FIG. 8.

As illustrated in FIGS. 8 and 9, to assemble the integrated enclosure, screws or similar means 82 engage housing apertures 80A and stanchion apertures 67 to couple housing 75 to frame support member 65.

In an alternative embodiment, as illustrated in FIGS. 10-13, first and second mirrored joinable sections, 110 and 115, can be used to create the encased receptacle. The identical sections may include engagement tabs 115A and 115B. One of the tabs 115A engages into a recess 65AB of stanchions 65A and 65B while another tab 115B bottom surface 115B1 slideably engages stanchion support member 65AC top surface 65AC1. This engagement allows for joinable sections 110 and 115 to be fixedly coupled to stanchions 65A and 65B while being joined together by screws 82.

Referring to FIG. 5, and in the preferred embodiment, encased receptacles 10 and 20 include a front face 130 having a top 130A, a bottom 130B, and left and right side surfaces 130C and 130D. These side surfaces 130A, 130B, 130C and 130D extend rearward to frame 60 surface lip extension 132.

Figure 12:
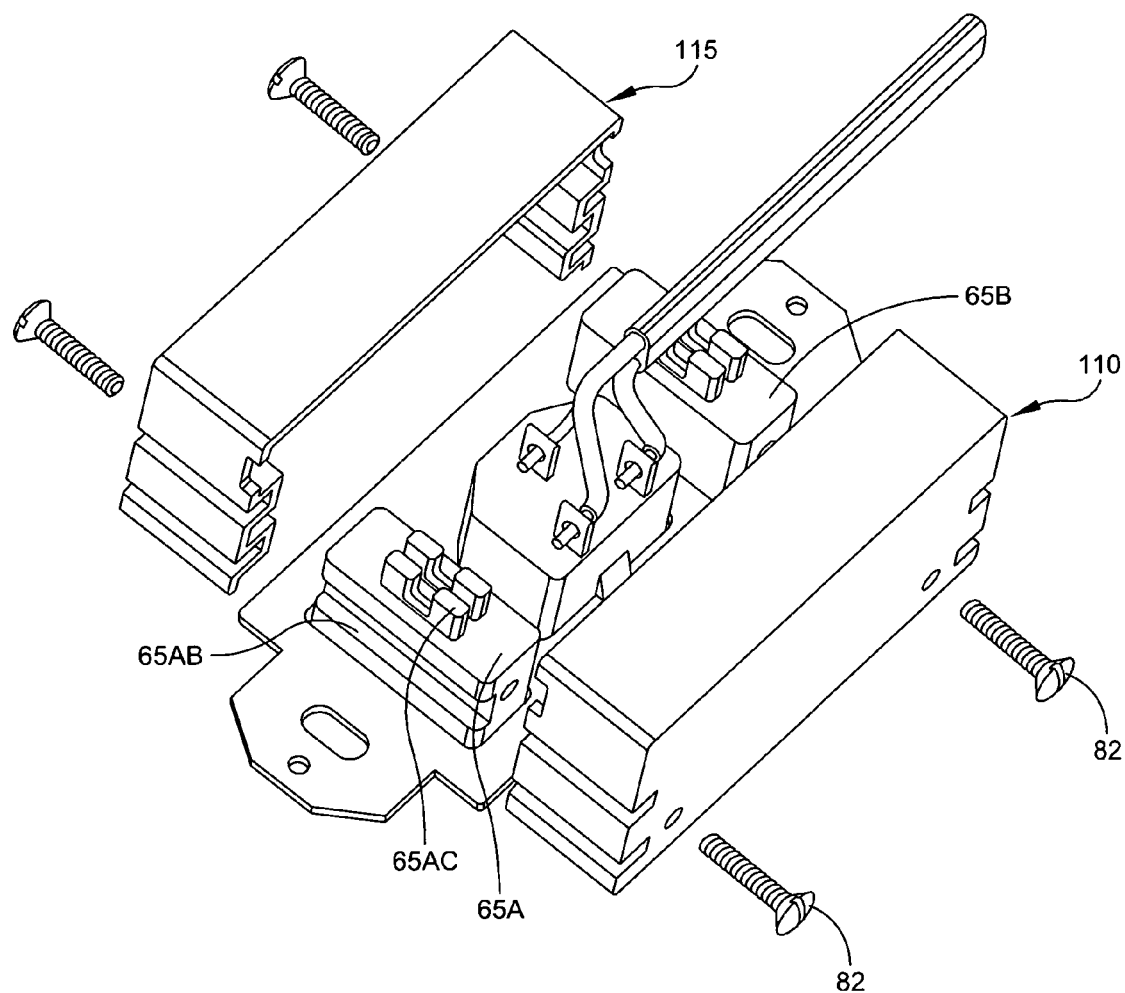
Figure 13:
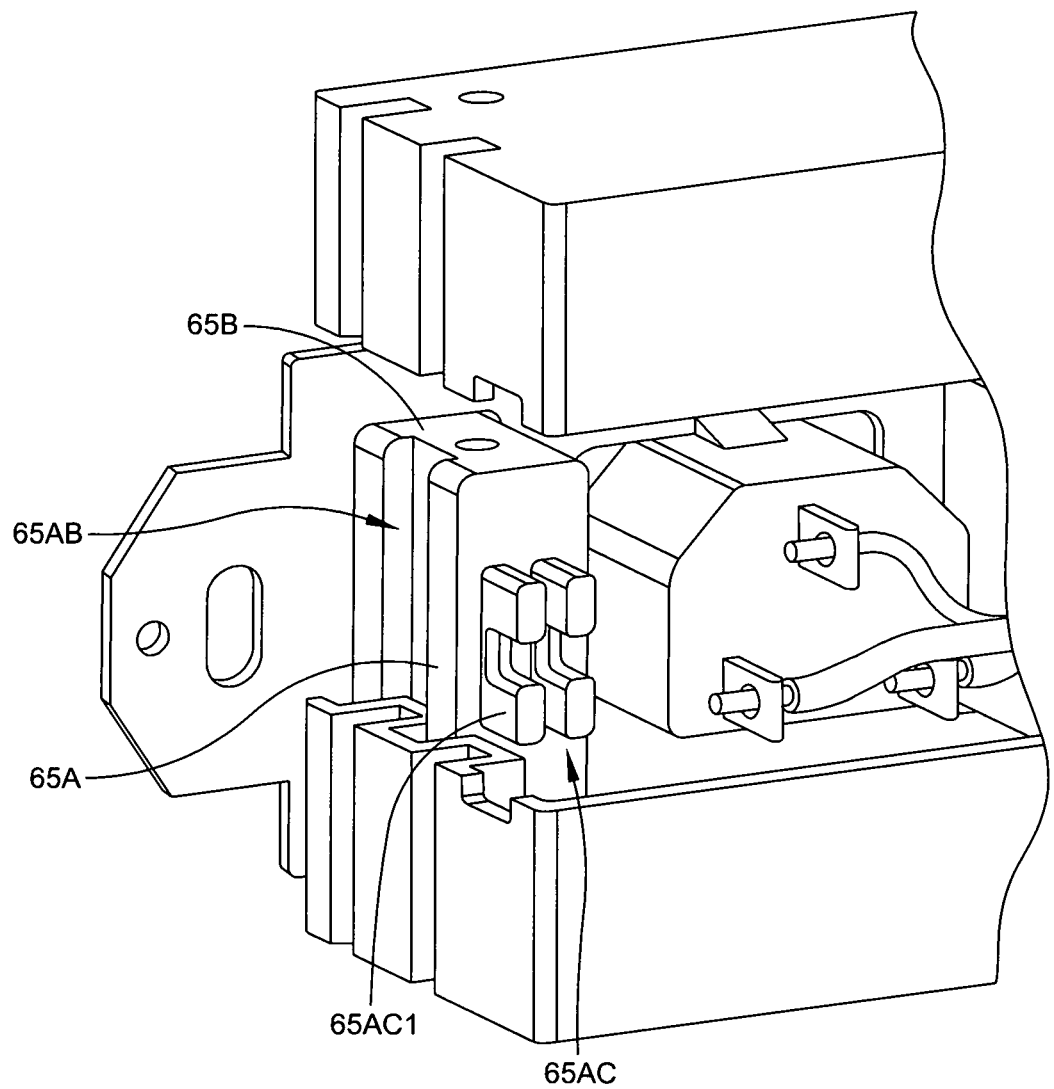

Referring to FIG. 12-14, the single gang recessed electrical box 120 includes an integrated face plate 122 with a flange 122B that extends outward beyond the periphery of box 120A. The box 120 includes wall mounting claws 124 that are adjustable to engage drywall or the like via positioning screws. The box includes connection apertures 120B for securing any of the various embodiments of encased receptacles discussed herein where the encased receptacles include the frame 60 and support frame 65. Opening 120C includes peripheral edge 120C1 and is approximately dimensioned to slideably engage the top 130A, a bottom 130B, and left and right side surfaces 130C and 130D of receptacles 10 and 20 to a point when frame 60 surface lip extension 132 rests against the rear surface 120C2 of box 120.

Since the electrical receptacles are electrically isolated and pre-wired in one of the various forms described herein, they can be mounted external to recessed electrical box 120, as illustrated in FIGS. 15 and 16. This creates a deep opening within the wall, and a receptacle face 130 in a flush mounted coplanar relationship with electrical box 120 interior surface 120C3.

As illustrated in FIG. 16, a larger front opening 120D is of sufficient length and width to allow access to the mounted receptacles 10 located inward of opening 120D.

I claim:
1. An encased power receptacle, comprising:
   a mounting frame having a first opening and at least one second opening therein, said mounting frame having a front and rear surface;
   a power receptacle positioned within said first opening, said power receptacle having a front face and rearward extending body, said front face protruding through said mounting frame front surface;
   a frame support member having a front and rear face, and a first opening, said rear face having at least one outwardly extending stanchion, said stanchion engaging said at least one second opening of said mounting frame, up to a point when said rear face rests against said mounting frame front surface, said frame support member first opening in communication with said mounting frame first opening, said power receptacle front face coplanar with said frame support member front surface;
   a housing having at least one aperture to receive said outwardly extending stanchion, said outwardly extending stanchion received up to a point where said housing is sealed against said mounting frame rear surface.

2. An encased power receptacle as in claim 1, wherein said frame support member front face comprises top, bottom, left and right side surfaces, said top, bottom, left and right side surfaces extending rearward to said mounting frame front surface, said mounting frame front surface having an orthogonal lip extension surface.

3. An encased power receptacle, comprising:
   a mounting frame having a first opening and at least one second opening therein, said mounting frame having a front and rear surface;
   a power receptacle positioned within said first opening, said power receptacle having a front face and rearward extending body, said front face protruding through said mounting frame front surface;
   a frame support member having a front and rear face, and a first opening, said rear face having at least one outwardly extending stanchion, wherein said outwardly extending stanchions include engagement channels thereon, said stanchion engaging said at least one second opening of said mounting frame, up to a point when said rear face rests against said mounting frame front surface, said frame support member first opening in communication with said mounting frame first opening, said power receptacle front face coplanar with said frame support member front surface;
   a housing comprising first and second joinable sections, said first and second joinable sections further including outwardly extending tabs, said outwardly extending tabs for slideable engagement within said stanchion engagement channels to join said first and second sections together.

4. An encased power receptacle as in claim 3, wherein said frame support member front face comprises top, bottom, left and right side surfaces, said top, bottom, left and right side surfaces extending rearward to said mounting frame front surface, said mounting frame front surface having an orthogonal lip extension surface.

\* \* \* \* \*